United States Patent
Lin et al.

(10) Patent No.: US 9,040,321 B2
(45) Date of Patent: May 26, 2015

(54) METHOD FOR MANUFACTURING LIGHT EMITTING DIODE PACKAGES

(71) Applicant: Zhongshan Innocloud Intellectual Property Services Co., Ltd., Zhongshan (CN)

(72) Inventors: Hou-Te Lin, Hsinchu (TW); Pin-Chuan Chen, Hsinchu (TW); Lung-Hsin Chen, Hsinchu (TW)

(73) Assignee: Zhongshan Innocloud Intellectual Property Services Co., Ltd., Zhongshan (CN)

( * ) Notice: Subject to any disclaimer, the term of this patent is extended or adjusted under 35 U.S.C. 154(b) by 0 days.

(21) Appl. No.: 14/191,375

(22) Filed: Feb. 26, 2014

(65) Prior Publication Data

US 2014/0248725 A1    Sep. 4, 2014

(30) Foreign Application Priority Data

Mar. 1, 2013    (CN) .................. 2013 1 00655263

(51) Int. Cl.
*H01L 21/00* (2006.01)
*H01L 33/62* (2010.01)
*H01L 23/00* (2006.01)

(52) U.S. Cl.
CPC ....... *H01L 33/62* (2013.01); *H01L 2224/48091* (2013.01); *H01L 2224/48247* (2013.01); *H01L 24/45* (2013.01); *H01L 24/48* (2013.01); *H01L 24/97* (2013.01); *H01L 2224/45144* (2013.01); *H01L 2224/48257* (2013.01); *H01L 2924/12041* (2013.01)

(58) Field of Classification Search
CPC ......... H01L 33/18; H01L 33/20; H01L 33/26; H01L 33/36; H01L 33/38; H01L 33/382; H01L 33/385; H01L 33/387; H01L 33/48; H01L 33/483; H01L 33/486; H01L 33/52; H01L 33/60
USPC .................. 257/92–100, 680, 690; 438/26, 27
See application file for complete search history.

(56) References Cited

U.S. PATENT DOCUMENTS

2013/0187188 A1* 7/2013 Sasaoka et al. ................. 257/99
2014/0042471 A1* 2/2014 Toyama et al. ................. 257/98

* cited by examiner

*Primary Examiner* — Brook Kebede
(74) *Attorney, Agent, or Firm* — Novak Druce Connolly Bove + Quigg LLP

(57) ABSTRACT

A method for manufacturing LED packages includes steps: providing a lead frame including many pairs of first and second electrodes, and first and second tie bars, the first electrodes and second electrodes each including a main body and an extension electrode protruding outward from the main body; forming many molded bodies to engage with the pairs of the first and second electrodes, the first and second main bodies being embedded into the molded bodies, and the first and second extension electrodes being exposed out from a corresponding molded body; preforming many first grooves at a bottom of each molded body; disposing LED dies in the corresponding receiving cavities; and cutting the molded bodies along edges thereof defining the first grooves in a first direction and then along a second direction perpendicular to the first direction to obtain many individual LED packages.

19 Claims, 19 Drawing Sheets

```
                                              ┌─ S101
┌─────────────────────────────────────────────────────┐
│ Providing a lead frame, the lead frame comprising a plurality of pairs of │
│ electrodes arranged in a matrix, each pair of electrodes comprising a first │
│ electrode and a second electrode adjacent to the first electrode, the first and │
│ second electrode each comprising an elongated main body and an extension │
│ electrode protruding outward from one end of the main body, the first │
│ electrodes arranged in the same column being connected by a first tie bar, │
│ and the second electrodes arranged in the same column being connected by a │
│ second tie bar │
└─────────────────────────────────────────────────────┘
                           ↓                  ┌─ S102
┌─────────────────────────────────────────────────────┐
│ Forming a plurality of molded bodies to correspond to the pairs of the first │
│ and second electrodes, each molded body surrounding and covering a │
│ plurality of pairs of the first and second electrodes disposed in two adjacent │
│ columns, and each molded body forming a plurality of reflecting cups, each │
│ reflecting cup defining a receiving cavity therein and being located over a │
│ corresponding pair of the first and second electrodes, wherein the first and │
│ second extension electrodes, together with the first and second tie bars, are │
│ exposed from an outer periphery of the corresponding molded body │
└─────────────────────────────────────────────────────┘
                           ↓                  ┌─ S103
┌─────────────────────────────────────────────────────┐
│ Preforming a plurality of first grooves at a bottom of each molded body, │
│ each first groove being located between two adjacent pairs of the first and │
│ second electrodes disposed in a column and extending transversely through │
│ opposite sides of the corresponding molded body, wherein a depth of the │
│ first groove is smaller than heights of the first and second electrodes │
└─────────────────────────────────────────────────────┘
                           ↓                  ┌─ S104
┌─────────────────────────────────────────────────────┐
│ Disposing a plurality of LED dies in the corresponding receiving cavities, │
│ each LED die being electrically connected to the corresponding pair of first │
│ and second electrodes exposed at a bottom of the corresponding receiving │
│ cavity │
└─────────────────────────────────────────────────────┘
                           ↓                  ┌─ S105
┌─────────────────────────────────────────────────────┐
│ Cutting the molded bodies along lines in alignment with edges of │
│ the first grooves in a first direction, and then along a second direction │
│ perpendicular to the first direction to obtain a plurality of individual LED │
│ packages │
└─────────────────────────────────────────────────────┘
```

FIG. 1

METHOD FOR MANUFACTURING LIGHT EMITTING DIODE PACKAGES

TECHNICAL FIELD

The present disclosure relates to a method for manufacturing light emitting diode (LED) packages, and particularly to a method for manufacturing LED packages wherein a molded body of each LED package has a firm connection with a lead frame thereof whereby the LED package can have a good sealing performance for an LED die thereof, and edges of the lead frame are smooth and without burr.

DESCRIPTION OF RELATED ART

LEDs are solid state light emitting devices formed of semiconductors, which are more stable and reliable than other conventional light sources such as incandescent bulbs. Thus, LEDs are widely used in various fields such as numeral/character displaying elements, signal lights, light sources for lighting and display devices.

A typical method for manufacturing LED package usually includes the following steps: providing a lead frame with electrical structures (i.e., electrodes) formed thereon; forming a molded body having a plurality of reflecting cups engaging with the lead frame, each reflecting cup defining a receiving cavity therein; disposing a plurality of LED dies in the receiving cavities and electrically connecting each LED die to a pair of electrical structures formed by the lead frame and exposed at the bottom of the corresponding receiving cavity by gold wires; forming an encapsulating layer in each receiving cavity to encapsulate the LED die therein; and cutting the molded body and the lead frame to obtain a plurality of individual LED packages. However, the LED packages manufactured by the method have a low bonding force between the molded body and the lead frame, whereby the molded body and the lead frame having the electrical structures are easily to separate from each other, resulting in a poor sealing performance for the LED dies of the LED packages. Moreover, the cutting process can leave burrs on the cut surfaces of the lead frame.

What is needed, therefore, is a method for manufacturing light emitting diode packages which can overcome the above-mentioned limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

FIG. 1 is a flow chart of a method for manufacturing light emitting diode packages in accordance with an exemplary embodiment of the present disclosure.

DETAILED DESCRIPTION

Figure 2:
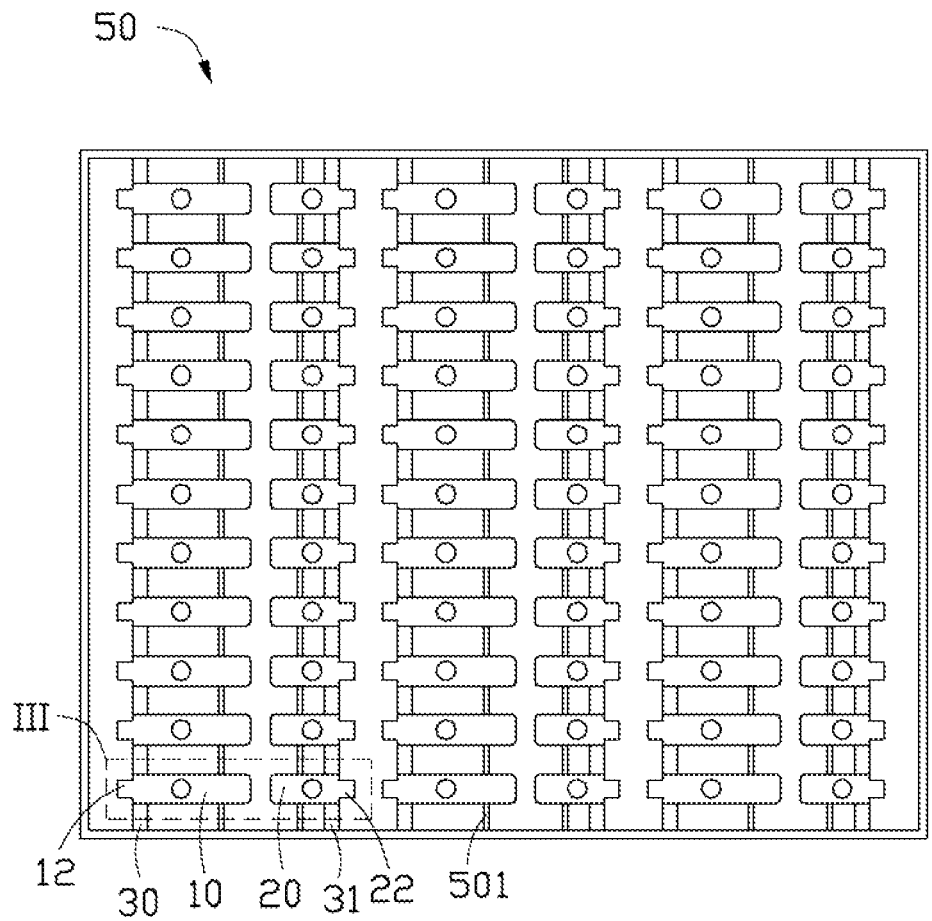
FIG. 2 is a top plan view of a lead frame for forming the light emitting diode packages in accordance with the present disclosure, wherein the lead frame is prepared in accordance with a first step of the method shown in FIG. 1.

Referring to FIG. 1, a method for manufacturing light emitting diode (LED) packages 100 (see FIGS. 17-19 which show one LED package 100) in accordance with an exemplary embodiment of the present disclosure is shown. The method includes the following steps:

In step S101 (also referring to FIG. 2), a lead frame 50 is provided, and the lead frame 50 includes a plurality of pairs of electrodes arranged in a matrix. Each pair of electrodes includes a first electrode 10 and a second electrode 20 adjacent to the first electrode 10. The first electrodes 10 arranged in a column are connected together by a first tie bar 30, and the second electrodes 20 arranged in a column are connected together by a second tie bar 31.

The lead frame 50 has a plurality of metal wires 501 extending between two opposite sides (i.e., the top side and the bottom side as viewed from FIG. 2) thereof. The first and second electrodes 10, 20 are firmly fixed onto the lead frame 50 by the metal wires 501. In the present embodiment, there are three columns of first electrodes 10 and three columns of second electrodes 20. The three columns of first electrodes 10 and the three columns of second electrodes 20 are arranged alternately along a predetermined direction (i.e., the left-to-right direction as viewed from FIG. 2) of the lead frame 50.

Referring also to FIGS. 3-7, because the plurality of pairs of electrodes, i.e., the first and second electrodes 10, 20, have structures similar to each other, this description and the accompanying drawings mainly illustrate one pair of the first and second electrodes 10, 20. The first electrode 10 includes an elongated first main body 11 having a top surface 111 and a bottom surface 112 at opposite sides thereof, a first extension electrode 12 protruding laterally from a left end of the first main body 11 and far away from the second electrode 20 which is in the same pair with the first electrode 10, and a first supporting branch 13 protruding downwardly from the bottom surface 112 of the first main body 11 and close to the second electrode 20 which is in the same pair with the first electrode 10.

Figure 3:
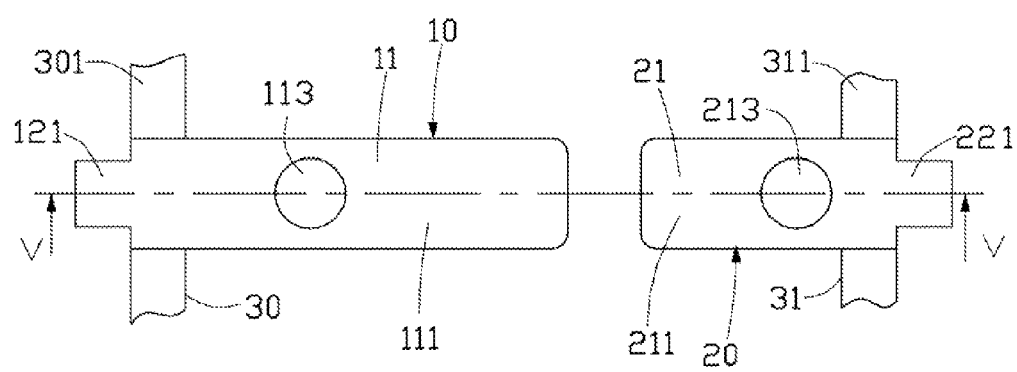
FIG. 3 is an enlarged view of part III of the lead frame of FIG. 2, and shows a pair of electrodes thereof, together with two tie bars respectively located at opposite outer ends of the pair of electrodes.
Figure 5:
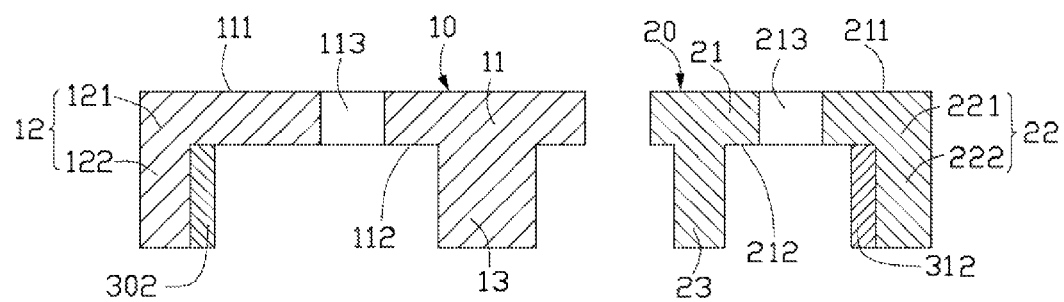
FIG. 5 is a cross-sectional view of the lead frame of FIG. 3, taken along line V-V thereof.

As shown in FIGS. 3 and 5, the second electrode 20 includes an elongated second main body 21 having a top surface 211 and a bottom surface 212 at opposite sides thereof, a second extension electrode 22 protruding laterally from a right end of the second main body 21 and far away from the first electrode 10 which is in the same pair with the second electrode 20, and a second supporting branch 23 protruding downwardly from the bottom surface 212 of the second main body 21 and close to the first electrode 10 which is in the same pair with the second electrode 20. In the present embodiment, the first main body 11 and the second main body 21 in the same pair are arranged, as depicted, in a line extending along the left-to-right direction. Widths of the first and second extension electrodes 12, 22 are smaller than that of the corresponding first and second main bodies 11, 21, respectively.

The first and second extension electrodes 12, 22 each have an inverted L-shaped configuration. The first extension electrode 12 includes a first connecting portion 121 extending horizontally and outwardly from the left end of the first main body 11, and a first extension portion 122 extending downwardly from a left end of the first connecting portion 121 and substantially perpendicular to the first connecting portion 121. The second extension electrode 22 includes a second connecting portion 221 extending horizontally and outwardly from the right end of the second main body 21, and a second extension portion 222 extending downwardly from a right end of the second connecting portion 221 and substantially perpendicular to the second connecting portion 221. Tops of the first and second extension electrodes 12, 22 are coplanar with tops of the first and second main bodies 11, 21. Bottoms of the first and second extension electrodes 12, 22 are coplanar with bottoms of the first and second supporting branches 13, 23.

Figure 4:
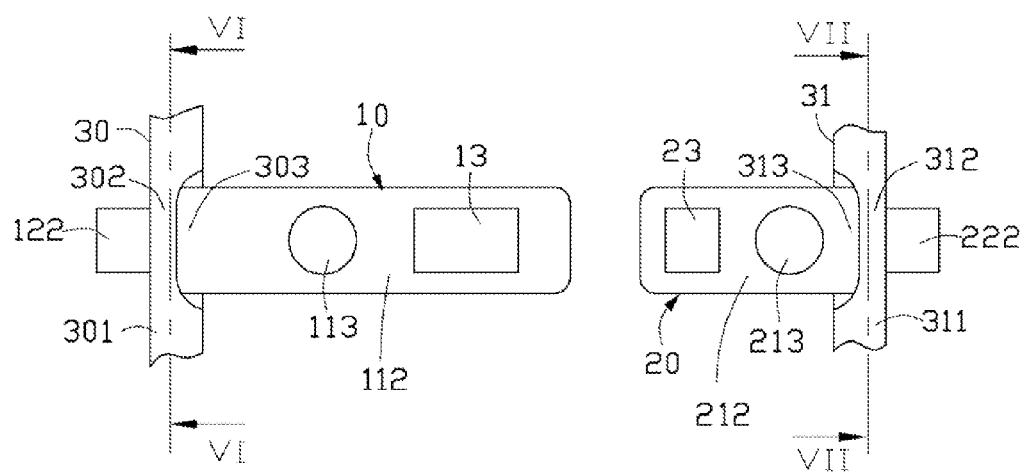
FIG. 4 is similar to FIG. 3, but viewed from an inverted aspect.

As shown in FIGS. 4 and 5, the first tie bar 30, for each first electrode 10, includes two first connecting sections 301 spaced from each other and a second connecting section 302 interconnecting the two spaced first connecting sections 301. The first connecting section 301 extends between two adjacent first main bodies 11 of two adjacent first electrodes 10 at the same column, and the second connecting section 302 extends across the bottom surface 112 of the first main body 11 of a corresponding first electrode 10. The second connecting section 302 abuts against an inner wall of the corresponding first extension electrode 12. A bottom of the second connection section 302 is coplanar with the bottom of the corresponding first extension electrode 12.

Figure 6:
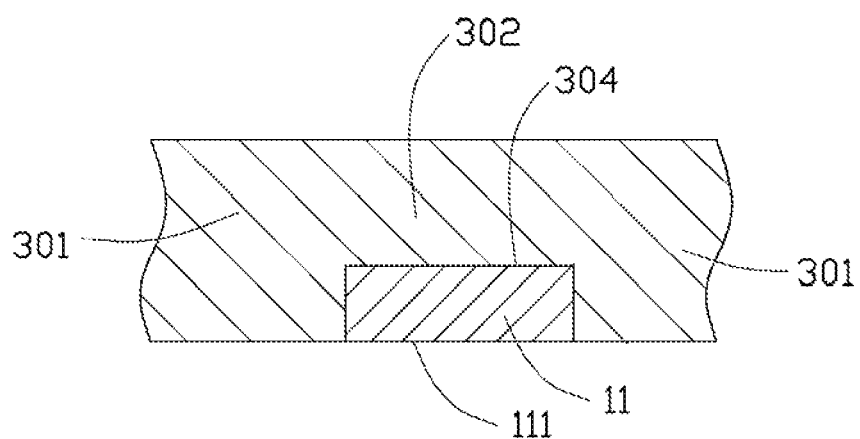
FIG. 6 is a cross-sectional view of the lead frame of FIG. 4, taken along line VI-VI thereof.

As shown in FIG. 6, a height of the second connecting section 302 is smaller than that of the first connecting section 301. Two adjacent first connecting sections 301 and the second connecting section 302 located therebetween cooperatively define a first depression 304 to receive the corresponding first main body 11 therein. The bottom surfaces (not labeled, shown as the top sides in FIG. 6) of the first and second connecting sections 301, 302 are coplanar with each other. A top surface (not labeled, shown as the bottom side in FIG. 6) of the first connecting section 301 is coplanar with the top surface 111 of the corresponding first main body 11.

As shown in FIGS. 3-4, the first and second tie bars 30, 31 are located near the outer ends of each pair of the first and second main bodies 11, 21, respectively. One side of the first tie bar 30 is substantially flush with one end of the corresponding first main body 11 of the first electrode 10 away from the second electrode 20 in the same pair with the first electrode 10, and one side of the second tie bar 31 is substantially flush with one end of the corresponding second main body 21 of the second electrode 20 away from the first electrode 10 in the same pair with the second electrode 20.

The second tie bar 31, for each second electrode 20, includes two third connecting sections 311 spaced from each other and a fourth connecting section 312 interconnecting the two spaced third connecting sections 311. The third connecting section 311 extends between two adjacent second main bodies 21, and the fourth connecting section 312 extends across the bottom surface 212 of the second main body 21 of a corresponding second electrode 20. The fourth connecting section 312 abuts against an inner wall of the corresponding second extension electrode 22 (see FIG. 5). A bottom of the fourth connection section 312 is coplanar with the bottom of the corresponding second extension electrode 22.

Figure 7:
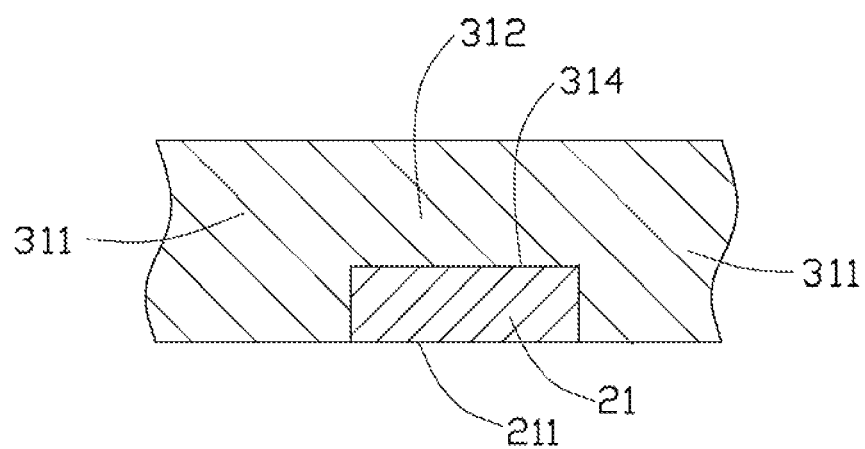
FIG. 7 is a cross-sectional view of the lead frame of FIG. 4, taken along line VII-VII thereof.

As shown in FIG. 7, a height of the fourth connecting section 312 is smaller than that of the third connecting section 311. Two adjacent third connecting sections 311 and the fourth connecting section 312 located therebetween cooperatively define a second depression 314 to receive the corresponding second main body 21 therein. The bottom surfaces (not labeled, shown as the top sides in FIG. 7) of the third and fourth connecting sections 311, 312 are coplanar with each other. A top surface (not labeled, shown as the bottom side in FIG. 7) of the third connecting section 311 is coplanar with the top surface 211 of the corresponding second main body 21.

As shown in FIG. 4, a width of the second connecting section 302 is smaller than that of the first connecting section 301. Two adjacent first connecting sections 301, the second connecting section 302 located therebetween and the first main body 11 cooperatively define a first arc-shaped recess 303, recessing leftwards toward the first extension portion 122. A width of the fourth connecting section 312 is smaller than that of the third connecting section 311. Two adjacent third connecting sections 311, the fourth connecting section 312 located therebetween and the second main body 21 cooperatively define a second arc-shaped recess 313, recessing rightwards toward the second extension portion 222.

As shown in FIGS. 4 and 5, the first and second supporting branches 13, 23 are square cylindrical. A width of the first supporting branch 13 is smaller than that of the first main body 11, and a width of the second supporting branch 23 is smaller than that of the second main body 21. The first supporting branch 13 is near the right end of the first main body 11 and adjacent to the second electrode 20, and the second supporting branch 23 is near the left end of the second main body 21 and adjacent to the first electrode 10.

The first electrode 10 further defines a first flow hole 113 extending through the first main body 11 thereof. The first flow hole 113 is located between the first extension electrode 12 and the first supporting branch 13. The second electrode 20 further defines a second flow hole 213 extending through the second main body 21 thereof. The second flow hole 213 is located between the second extension electrode 22 and the second supporting branch 23.

Figure 12:
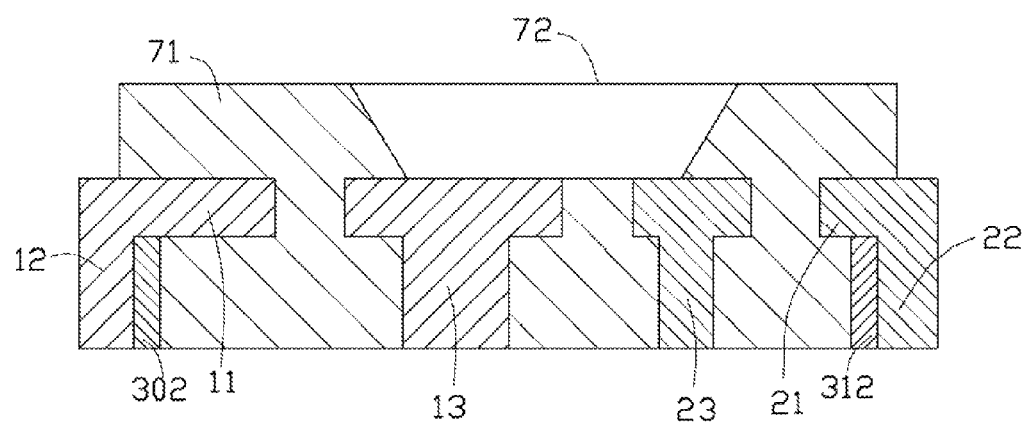
FIG. 12 is a cross-sectional view of the semi-finished product of FIG. 11, taken along line XII-XII thereof.
Figure 13:
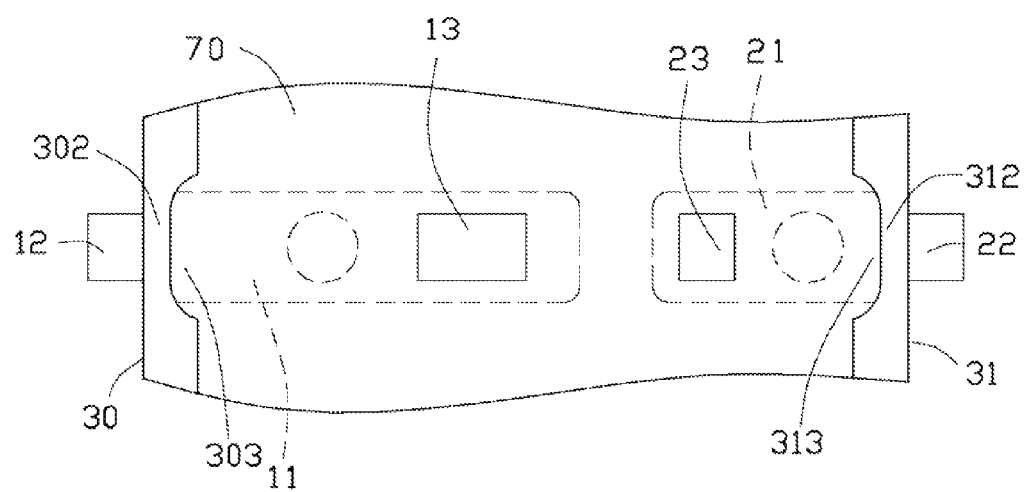
FIG. 13 is similar to FIG. 11, but viewed from an inverted aspect.

In step S102 (also referring to FIGS. 10-13), a molded base consisting of a plurality of molded bodies 70 is formed to engage with the lead frame 50. The molded bodies 70 are formed corresponding to the pairs of the first and second electrodes 10, 20, respectively. In the depicted embodiment, there are three molded bodies 70. Each molded body 70 surrounds and covers a plurality of pairs of the first and second electrodes 10, 20 disposed in two adjacent columns. Each molded body 70 forms a plurality of reflecting cups 71. Each reflecting cup 71 defines a receiving cavity 72 therein, and the receiving cavity 72 is located above a corresponding pair of the first and second electrodes 10, 20. The first and second extension electrodes 12, 22, together with the first and second tie bars 30, 31 are exposed from a periphery of the corresponding molded body 70. Bottoms of the first and second supporting branches 13, 23 are exposed at a bottom of the corresponding molded body 70 (see FIG. 12).

Figure 8:
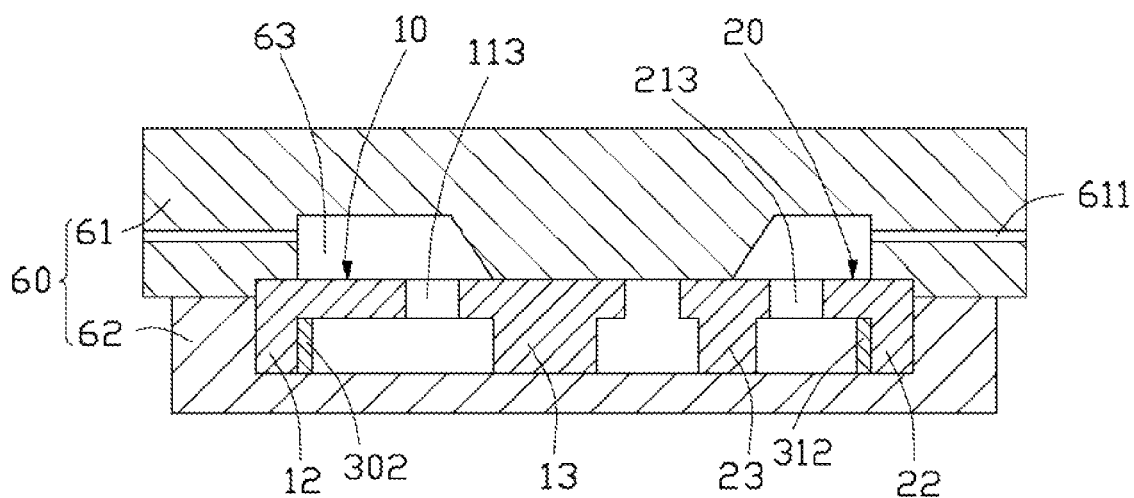
FIG. 8 is a schematic, cross-sectional view of a part of the lead frame of FIG. 2, together with a mold accommodating the part of the lead frame therein, wherein only a pair of electrodes of the lead frame is shown.
Figure 9:
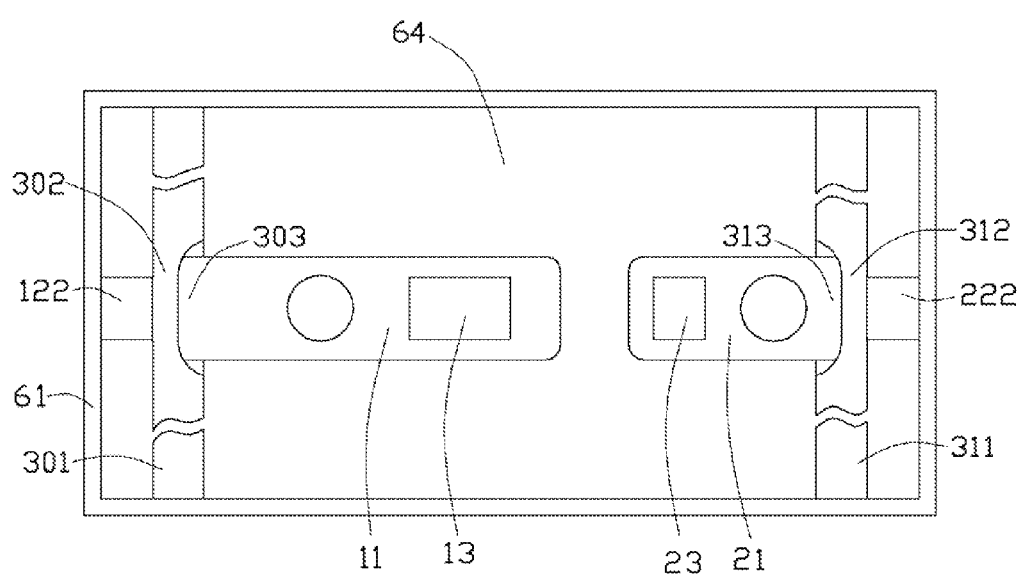
FIG. 9 is similar to FIG. 8, but viewed from a bottom of the part of the lead frame shown in FIG. 8, wherein a female mold (i.e., a lower half) of the mold is removed for clarity.
Figure 10:
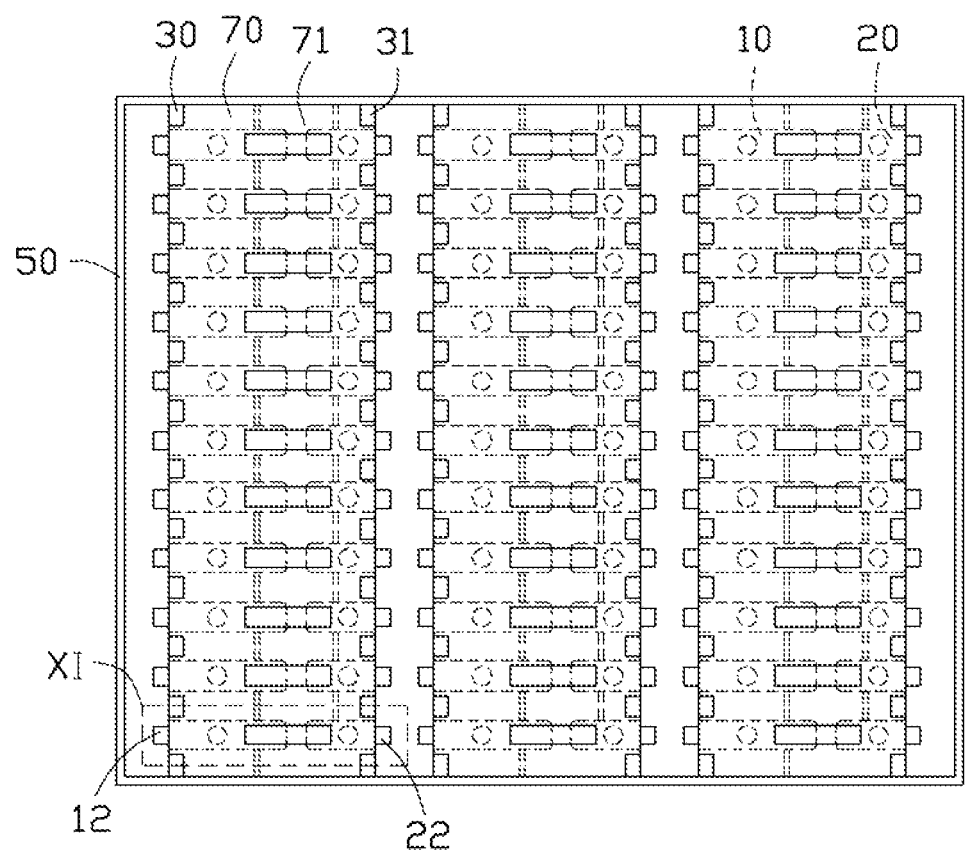
FIG. 10 is a top plan view of a semi-finished product for forming the light emitting diode packages in accordance with the present disclosure, wherein the semi-finished product is obtained by a second step of the method shown in FIG. 1.
Figure 11:
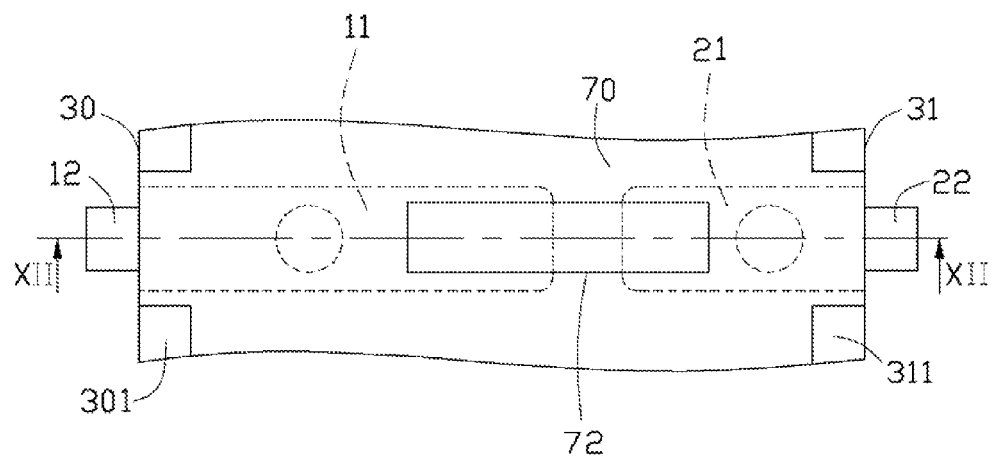
FIG. 11 is an enlarged view of part XI of the semi-finished product of FIG. 10.

Referring to FIGS. 8-9, the molded bodies 70 are formed in a mold 60 by injection molding. The mold 60 includes a male mold 61, and a female mold 62 engaged with the male mold 61. The male and female molds 61, 62 cooperatively define a cavity 63 therein. The lead frame 50 is received in the cavity 63 of the mold 60.

Tops of the first and second extension electrodes 12, 22 of each pair of the first and second electrodes 10, 20 are covered and totally engaged by the male mold 61. Tops of the first and second main bodies 11, 21 of each pair of the first and second electrodes 10, 20 are covered and partially engaged by the male mold 61. The first tie bar 30 and the second tie bar 31 adjacent to the first tie bar 30 and two opposite sides of the lead frame 50 cooperatively define an enclosed area 64 therebetween.

The molded body 70 is made of a material selected from a group consisting of polyphthalamide (PPA) resin, epoxy molding compound, and silicone molding compound. The melted molding material is injected into the enclosed areas 64 through channels 611 formed in the male mold 61. The molding material flows around the first and second supporting branches 13, 23 and the first and second arc-shaped recesses 303, 313, and flows through the first and second flow holes 113, 213 to fill the cavity 63, thereby forming the reflecting cups 71. The plurality of reflecting cups 71 of a corresponding molded body 70 is arranged in a column. Each reflecting cup 71 is located on a corresponding pair of the first and second electrodes 10, 20 and defines a receiving cavity 72 located above the corresponding pair of the first and second electrodes 10, 20.

Figure 14:
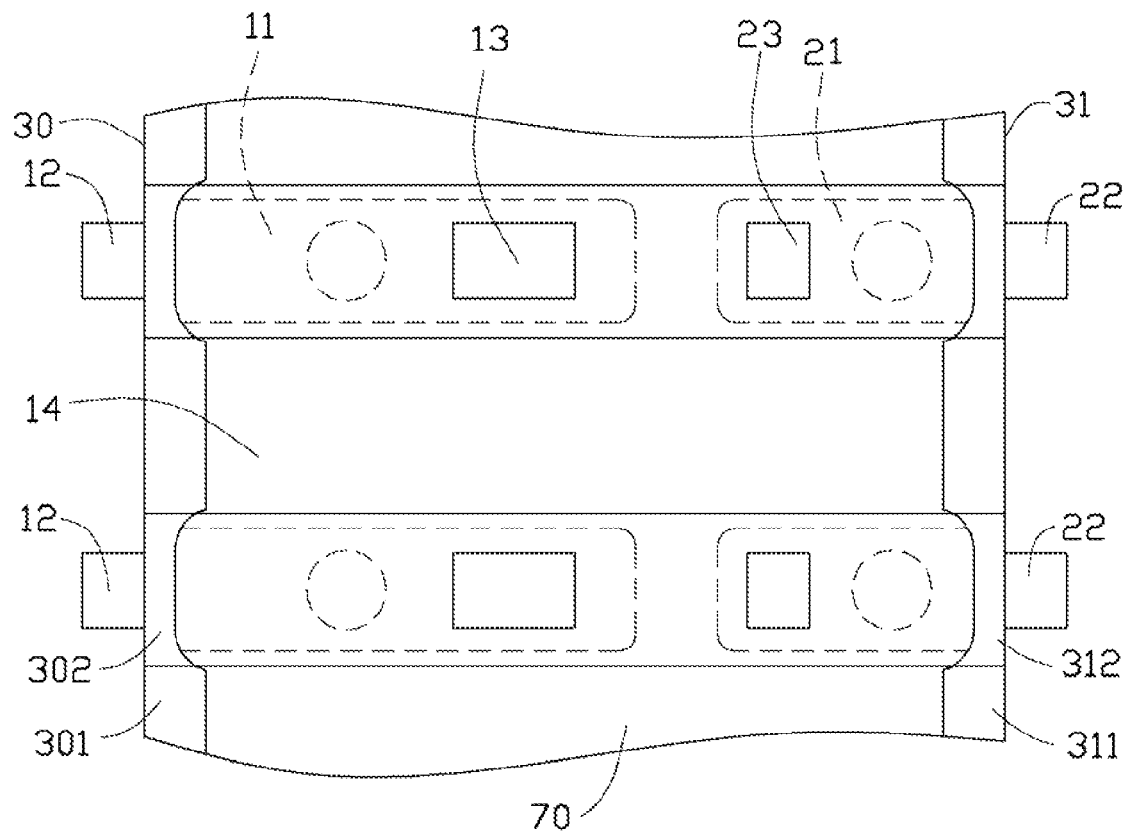
FIG. 14 is a bottom view of a semi-finished product for forming the light emitting diode packages in accordance with the present disclosure, wherein the semi-finished product is obtained by a third step of the method shown in FIG. 1.
Figure 15:
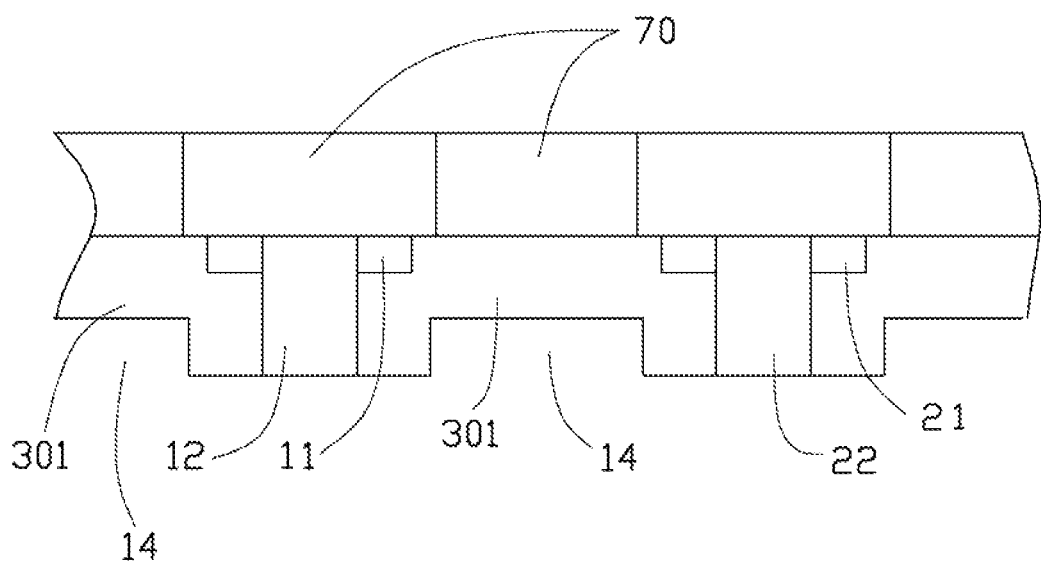
FIG. 15 is similar to FIG. 14, but viewed from a left-side aspect.
Figure 16:
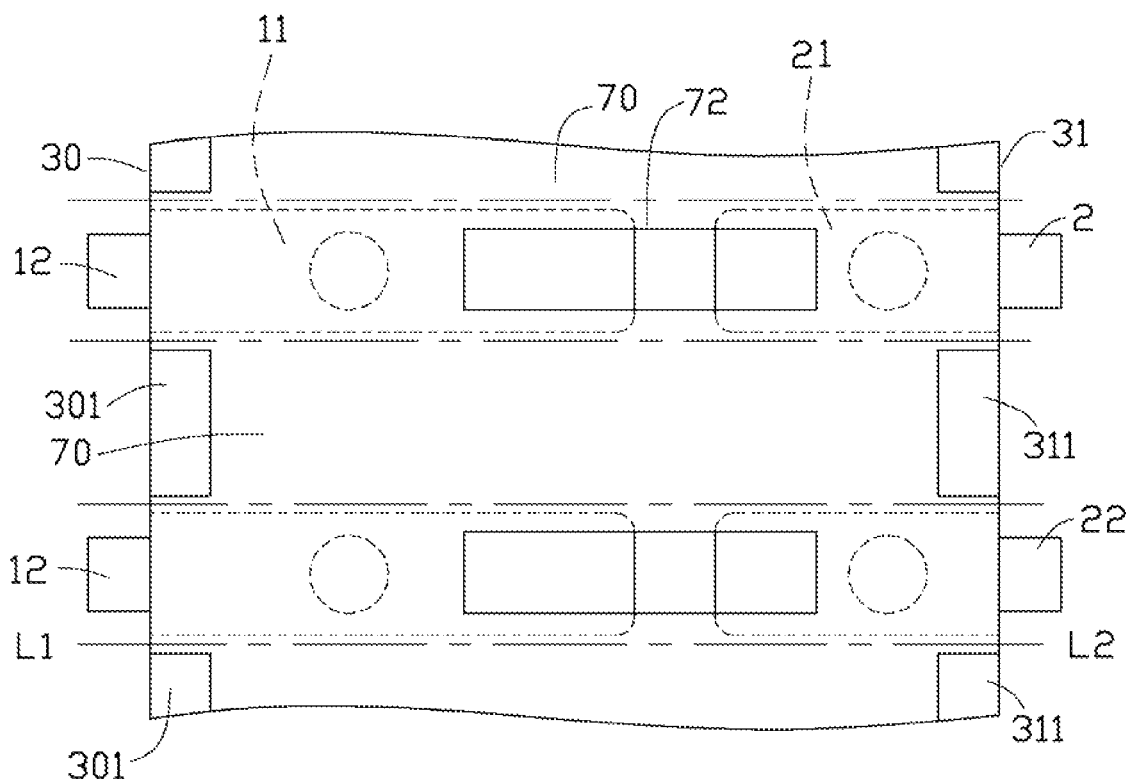
FIG. 16 is similar to FIG. 14, but viewed from an inverted aspect.

In step S103 (also referring to FIGS. 14-16), a plurality of first grooves 14 in parallel to each other are formed at a bottom of each molded body 70. Each first groove 14 is located between two adjacent pairs of the first and second electrodes 10, 20 disposed in a corresponding molded body 70 and extends transversely through opposite sides of the corresponding molded body 70. A depth of the first groove 14 is smaller than heights of the first and second electrodes 10, 20. It is preferred that a depth of the first groove 14 is equal to a half of a height of the first or second extension electrode 12, 22.

In step S104, a plurality of LED dies 80 are disposed in the corresponding receiving cavities 72. Each LED die 80 is electrically connected to the corresponding pair of the first and second electrodes 10, 20 exposed at a bottom of the corresponding receiving cavity 72 via gold wires 81, 82 (see FIGS. 17 and 18).

Figure 17:
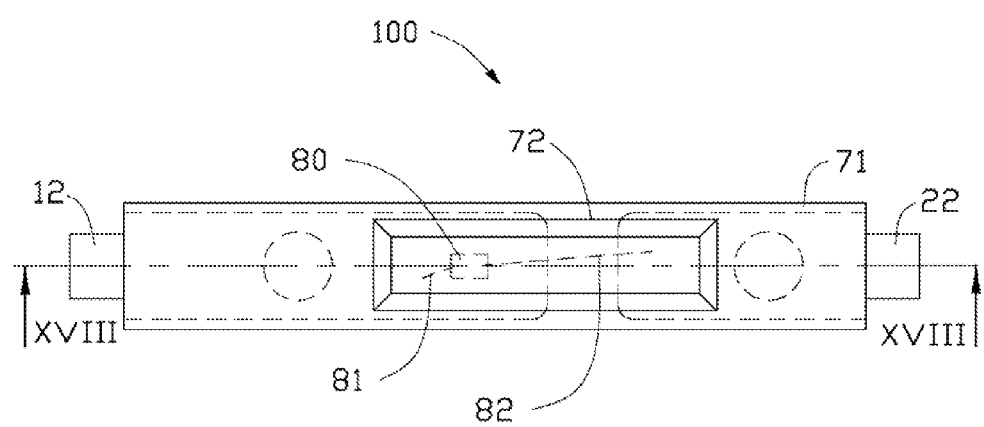
FIG. 17 is a top view of a light emitting diode package obtained by the method shown in FIG. 1.
Figure 18:
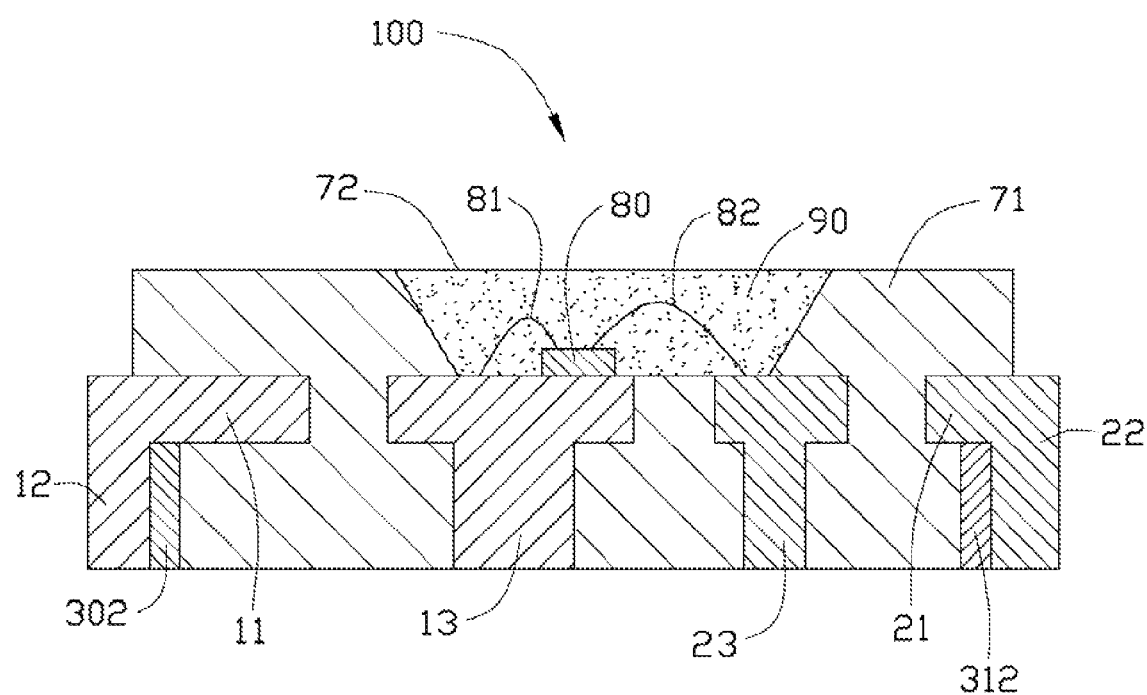
FIG. 18 is a cross-sectional view of the light emitting diode package of FIG. 17, taken along line XVIII-XVIII thereof.
Figure 19:
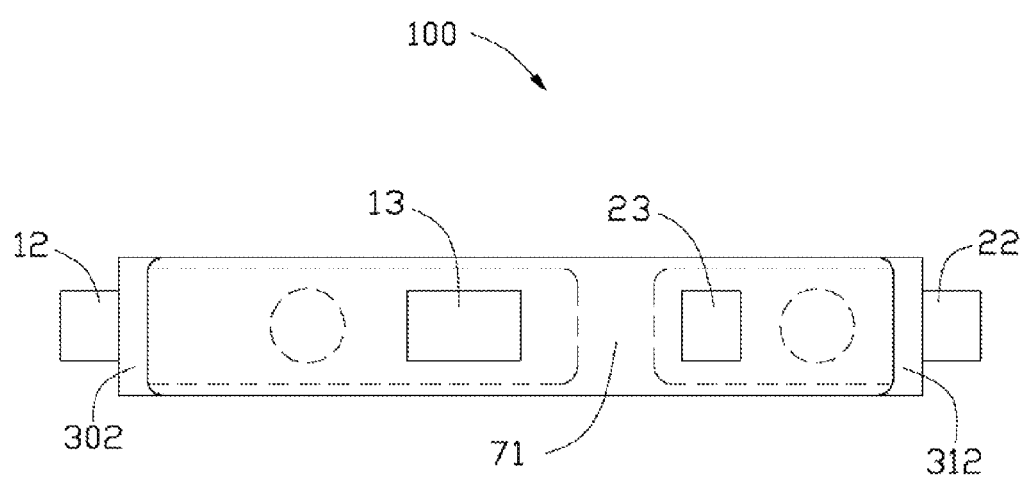
FIG. 19 is similar to FIG. 17, but viewed from an inverted aspect.

In step S105, the molded bodies 70 are cut along lines $L_1L_2$ (see FIG. 16) through the molded bodies 70, wherein the lines $L_1L_2$ are coincident with edges of the molded bodies 70 defining the first grooves 14 in a first direction after the step of disposing the LED dies 80 into the corresponding receiving cavities 72, and then along a second direction perpendicular to the first direction to obtain a plurality of individual LED packages 100 as shown in FIGS. 17-19. In the present embodiment, the molded bodies 70 are separated into individual elements by mechanically cutting along lines $L_1L_2$ in a transverse direction to cut the molded bodies 70 along the corresponding first grooves 14 and then along a longitudinal direction perpendicular to the transverse direction.

Referring to FIGS. 17-19, the LED package 100 includes a pair of the first and second electrodes 10, 20, a reflecting cup 71 surrounding the pair of the first and second electrodes 10, 20, and an LED die 80 disposed in the receiving cavity 72 of the reflecting cup 71 and electrically connected to the pair of the first and second electrodes 10, 20. The first and second extension electrodes 12, 22 are exposed out of a periphery of the corresponding reflecting cup 71. The first and second supporting branches 13, 23 are exposed at a bottom of the corresponding reflecting cup 71.

Alternatively, the LED dies 80 can be disposed in the corresponding receiving cavities 72 of the reflecting cups 71 after the step of cutting the molded bodies 70 into a plurality of individual elements.

It is to be understood that the method further includes a step of forming an encapsulant layer 90 (see FIG. 18) in the receiving cavity 72 of each reflecting cup 71 to encapsulate the LED die 80 after the LED dies 80 are disposed in the corresponding receiving cavities 72. The encapsulant layer 90 contains phosphor particles (not labeled) therein to convert a wavelength of light emitted from the LED die 80.

In the present disclosure, the first and second main bodies 11, 21 and the first and second supporting branches 13, 23 of each pair of the first and second electrodes 10, 20 are embedded into the corresponding reflecting cup 71; thus the bonding strength between each pair of the first and second electrodes 10, 20 and the corresponding reflecting cup 71 is enhanced. Furthermore, a plurality of first grooves 14 are preformed at the bottom of each molded body 70, which can reduce burrs on the cut surface of the first and second tie bars 30, 31 after the step of cutting the molded bodies 70 into a plurality of individual elements. In addition, the first and second flow holes 113, 213 and the first and second arc-shaped recesses 303, 313 greatly increase an effective attaching area between each pair of the first and second electrodes 10, 20 and the corresponding molded body 70, thereby improving mechanical strength and sealing performance of the LED package 100.

The LED package 100 can be electrically connected to external power source (not shown) through bottoms of the first and second supporting branches 13, 23 or the first and second extension electrodes 12, 22; thus the LED package 100 can be used as a top-view type light source or a side-view type light source according to actual requirements.

In use, heat generated from the LED die 80 is mainly conducted to the first and second electrodes 10, 20; a part of the heat absorbed by the first and second electrodes 10, 20 is dissipated to the ambient environment through the bottoms of the first and second supporting branches 13, 23, and another part of the heat absorbed by the first and second electrodes 10, 20 is dissipated to the ambient environment through the first and second extension electrodes 12, 22. Thus, the LED package 100 can have a high heat-dissipating efficiency.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A method for manufacturing LED (light emitting diode) packages comprising:
   providing a lead frame, the lead frame comprising a plurality of pairs of electrodes arranged in a matrix, and a plurality of first and second tie bars, each pair of electrodes comprising a first electrode and a second electrode adjacent to the first electrode, the first electrodes being arranged in a plurality of columns, and the second electrodes being arranged in a plurality of columns, wherein each first electrode comprises an elongated first main body and a first extension electrode protruding laterally from one end of the first main body, each second electrode comprises an elongated second main body and a second extension electrode protruding laterally from one end of the second main body, the first electrodes arranged in the same column are connected by a corresponding first tie bar, and the second electrodes arranged in the same column are connected by a corresponding second tie bar;
   forming a plurality of molded bodies engaging with the pairs of the first and second electrodes, each molded body surrounding and covering a plurality of pairs of the first and second electrodes disposed in two adjacent columns, and each molded body forming a plurality of reflecting cups, each reflecting cup defining a receiving cavity therein and being located over a corresponding pair of the first and second electrodes, wherein the first and second extension electrodes, together with the first and second tie bars, are exposed from an outer periphery of a corresponding molded body;
   preforming a plurality of first grooves at a bottom of each molded body, each first groove being located between two adjacent pairs of the first and second electrodes disposed in a corresponding molded body and extending transversely through opposite sides of the corresponding molded body, wherein a depth of the first groove is smaller than heights of the first and second electrodes;
   disposing a plurality of LED dies in the receiving cavities, respectively, each LED die being electrically connected to the corresponding pair of first and second electrodes exposed at a bottom of a corresponding receiving cavity; and
   cutting the molded bodies along edges thereof defining the first grooves in a first direction and then along a second direction perpendicular to the first direction to obtain a plurality of individual LED packages, each LED package comprising a pair of the first and second electrodes, a reflecting cup surrounding the pair of the first and second electrodes, and an LED die disposed in a receiving cavity of the reflecting cup.

2. The method for manufacturing LED packages of claim 1, wherein the first extension electrode of each pair of the first and second electrodes is located at the end of the first main body away from the second electrode, and the second extension electrode of each pair of the first and second electrodes is located at the end of the second main body away from the first electrode.

3. The method for manufacturing LED packages of claim 2, wherein the first and second main bodies each comprise a top surface and a bottom surface at opposite sides thereof, the first electrode further comprises a first supporting branch protruding downwardly from the bottom surface of the first main body thereof, and the second electrode further comprises a second supporting branch protruding downwardly from the bottom surface of the second main body thereof.

4. The method for manufacturing LED packages of claim 3, wherein the first and second supporting branches are embedded into the corresponding molded body, and bottoms of the first and second supporting branches are exposed out at a bottom of the corresponding molded body.

5. The method for manufacturing LED packages of claim 2, wherein the first and second extension electrodes each have an inverted L-shaped configuration.

6. The method for manufacturing LED packages of claim 5, wherein each first extension electrode comprises a first connecting portion extending horizontally and outwardly from the corresponding first main body and a first extension portion extending downwardly from the distal end of the first connecting portion, and each second extension electrode comprises a second connecting portion extending horizontally and outward from the corresponding second main body and a second extension portion extending downwardly from the distal end of the second connecting portion.

7. The method for manufacturing LED packages of claim 6, wherein tops of the first and second extension electrodes are respectively coplanar with tops of the corresponding first and second main bodies, and bottoms of the first and second extension electrodes are coplanar with a bottom of the corresponding molded body.

8. The method for manufacturing LED packages of claim 6, wherein the first tie bar comprises a plurality of spaced first connecting sections and a plurality of second connecting sections each interconnecting two adjacent spaced first connecting sections, and the second tie bar comprises a plurality of spaced third connecting sections and a plurality of fourth connecting sections each interconnecting two adjacent spaced third connecting sections, and wherein the first connecting section of the first tie bar extends between two adjacent first main bodies at the same column, the second connecting section of the first tie bar extends across a bottom surface of the corresponding first main body, the third connecting section of the second tie bar extends between two adjacent second main bodies, and the fourth connecting section of the second tie bar extends across a bottom surface of the corresponding second main body.

9. The method for manufacturing LED packages of claim 8, wherein a height of the second connecting section of the first tie bar is smaller than that of the first connecting section of the first tie bar, two adjacent first connecting sections and the second connecting section located therebetween cooperatively define a first depression to receive the corresponding first main body therein, a height of the fourth connecting section of the second tie bar is smaller than that of the third connecting section of the second tie bar, and two adjacent thirds connecting sections and the fourth connecting section located therebetween cooperatively define a second depression to receive the corresponding second main body therein.

10. The method for manufacturing LED packages of claim 9, wherein the first tie bar abuts against the first extension electrode of the corresponding first electrode, and the second tie bar abuts against the second extension electrode of the corresponding second electrode.

11. The method for manufacturing LED packages of claim 10, wherein tops of the first and third connecting sections of the first and second tie bars are respectively coplanar with tops of the corresponding first and second main bodies, and bottoms of the first and second tie bars are respectively coplanar with the corresponding first and second extension electrodes.

12. The method for manufacturing LED packages of claim 9, wherein a width of the second connecting section of the first tie bar is smaller than that of the first connecting section of the first tie bar, and a width of the fourth connecting section of the second tie bar is smaller than that of the third connecting section of the second tie bar, and wherein two adjacent first connecting sections, the second connecting section located therebetween and the corresponding first main body cooperatively define a first recess at one side of the first tie bar, the first recess recessing away from the fourth connecting section, and two adjacent third connecting sections, the fourth connecting section located therebetween and the corresponding second main body cooperatively define a second recess at one side of the second tie bar, the second recess recessing away from the second connecting section, and the first and second recesses are completely filled by the corresponding molded body.

13. The method for manufacturing LED packages of claim 2, wherein the grooves formed in each corresponding molded body are parallel to each other.

14. The method for manufacturing LED packages of claim 2, wherein each first electrode further comprises a first flow hole extending through the first main body thereof, and each second electrode further comprises a second flow hole extending through the second main body thereof, and the first and second flow holes are completely filled by the corresponding molded body.

15. The method for manufacturing LED packages of claim 2, wherein one side of the first tie bar is substantially flush with one end of the corresponding first main body of the first electrode away from the second electrode in the same pair with the first electrode, and one side of the second tie bar is substantially flush with one end of the corresponding second main body of the second electrode away from the first electrode in the same pair with the second electrode.

16. The method for manufacturing LED packages of claim 2, further comprising a step of forming an encapsulant layer in the receiving cavity of each reflecting cup to encapsulate the LED die therein after the step of disposing the LED dies in the cavities, respectively.

17. The method for manufacturing LED packages of claim 16, wherein the encapsulant layer contains phosphor particles therein.

18. The method for manufacturing LED packages of claim 2, wherein the molded body is formed in a mold by injection molding, the mold comprising a male mold and a female mold engaged with the male mold, the male mold and the female mold cooperatively defining a cavity to receive the lead frame therein.

19. The method for manufacturing LED packages of claim 18, wherein tops of the first and second electrodes are covered and partially engaged by the male mold, and the molding material flows in a plurality of enclosed areas, each enclosed area being cooperatively defined by a corresponding first tie bar, a corresponding second tie bar adjacent to the corresponding first tie bar and two opposite sides of the lead frame.

\* \* \* \* \*